United States Patent
Harris

(10) Patent No.: US 7,786,766 B2
(45) Date of Patent: Aug. 31, 2010

(54) APPLIANCE CONTROL SYSTEM WITH A ZERO CROSSING DETECTING CIRCUIT

(75) Inventor: Robert C. Harris, Springfield, TN (US)

(73) Assignee: Electrolux Home Products, Inc, Cleveland, OH (US)

( * ) Notice: Subject to any disclaimer, the term of this patent is extended or adjusted under 35 U.S.C. 154(b) by 51 days.

(21) Appl. No.: 12/265,926

(22) Filed: Nov. 6, 2008

(65) Prior Publication Data

US 2010/0109748 A1    May 6, 2010

(51) Int. Cl.
    *H03K 5/22* (2006.01)
(52) U.S. Cl. .......................................... 327/79
(58) Field of Classification Search ................ 327/77, 327/78, 79
    See application file for complete search history.

(56) References Cited

U.S. PATENT DOCUMENTS

| | | |
|---|---|---|
| 4,745,515 A | 5/1988 | Fowler |
| 5,218,509 A | 6/1993 | Fowler |
| 5,347,420 A | 9/1994 | Fowler |
| 5,452,176 A | 9/1995 | Fowler |
| 5,477,032 A | 12/1995 | Fowler et al. |
| 5,616,269 A | 4/1997 | Fowler et al. |
| 5,618,460 A | 4/1997 | Fowler et al. |
| 5,652,691 A | 7/1997 | Fowler |
| 5,653,906 A | 8/1997 | Fowler et al. |
| 7,420,142 B2 * | 9/2008 | Barrena et al. .............. 219/501 |
| 2005/0168074 A1 | 8/2005 | To |

FOREIGN PATENT DOCUMENTS

EP    0590687    4/1994

OTHER PUBLICATIONS

International Search Report for PCT/US2009/061461, dated May 11, 2010, 2 pages.

* cited by examiner

*Primary Examiner*—Jeffrey S Zweizig
(74) *Attorney, Agent, or Firm*—Pearne & Gordon LLP

(57) ABSTRACT

A control system includes a zero crossing detecting circuit for detecting a zero crossing of an AC signal. The circuit includes a transformer having a primary portion and a secondary portion. The primary portion receives the AC signal. The secondary portion comprises first and second terminals. The first terminal is biased at a first DC voltage level. An output switch is operatively connected to the second terminal and has an on state and an off state. The output switch selectively activates an output signal of the zero crossing detecting circuit according to an activation voltage level sensed by the output switch and corresponding to the zero crossing. While in the off state, the output switch is biased at a second DC voltage level. A voltage difference between the first and second DC voltage levels substantially equals the activation voltage level. A controller monitors the output signal and controls an operation based on the output signal.

24 Claims, 3 Drawing Sheets

APPLIANCE CONTROL SYSTEM WITH A ZERO CROSSING DETECTING CIRCUIT

BACKGROUND OF THE INVENTION

1. Field of the Invention

The present invention relates to appliance control systems, and particularly to appliance control systems having a circuit for detecting a zero crossing of an AC signal.

2. Description of Related Art

It is known to detect the zero crossing of an AC waveform or signal. The zero crossing is a point on the AC signal having zero electrical potential (i.e., 0 VAC).

It is further known to detect the zero crossing of a power supply waveform of an AC power source and to control various operations based on the detection of the zero crossing. For example, switching operations may be timed to generally coincide with the zero crossing of the AC power source.

BRIEF SUMMARY OF THE INVENTION

In accordance with one aspect of the present invention, provided is a control system that includes a zero crossing detecting circuit for detecting a zero crossing of an AC signal. The zero crossing detecting circuit includes a transformer having a primary portion and a secondary portion. The primary portion receives the AC signal. The secondary portion comprises a first terminal and a second terminal. The first terminal is biased at a first DC voltage level. An output switch is operatively connected to the second terminal and has an on state and an off state. The output switch selectively activates an output signal of the zero crossing detecting circuit according to an activation voltage level sensed by the output switch and corresponding to the zero crossing. While in the off state, the output switch is biased at a second DC voltage level. A voltage difference between the first and second DC voltage levels substantially equals the activation voltage level. A controller monitors the output signal of the zero crossing detecting circuit and controls an operation based on the output signal.

In accordance with another aspect of the present invention, provided is a control system for a domestic appliance. The control system includes a zero crossing detecting circuit for detecting a zero crossing of an AC signal. The zero crossing detecting circuit includes a transformer having a primary portion and a secondary portion. The primary portion receives the AC signal. The secondary portion comprises a first terminal and a second terminal. The zero crossing detecting circuit includes a first bipolar junction transistor and a second bipolar junction transistor. The first bipolar junction transistor includes a first base, a first collector, and a first emitter. A DC bias voltage level at the first terminal substantially equals a DC voltage level at the first base and the first collector. The second bipolar junction transistor includes a second base, a second collector and a second emitter. The second bipolar junction transistor is biased at another DC voltage level that is different from the DC bias voltage level at the first terminal. A voltage difference between the another DC voltage level and the DC bias voltage level at the first terminal substantially equals a voltage difference between the first base and the first emitter. The second base receives a signal from the second terminal. The second bipolar junction transistor selectively activates an output signal of the zero crossing detecting circuit based on the zero crossing of the AC signal. The control system includes a switching device and a controller including a microprocessor. The microprocessor monitors the output signal of the zero crossing detecting circuit and controls an operation of the switching device based on the output signal of the zero crossing detecting circuit.

In accordance with another aspect of the present invention, provided is a control system for a domestic appliance. The control system includes a zero crossing detecting circuit for detecting a zero crossing of an AC signal. The zero crossing detecting circuit includes a circuit ground having a circuit ground voltage level and a transformer having a primary portion and a secondary portion. The primary portion receives the AC signal. The secondary portion comprises a first terminal and a second terminal. The first terminal is biased at a first DC voltage level that is not equal to the circuit ground voltage level. The zero crossing detecting circuit includes an output switch comprising a bipolar junction transistor. The bipolar junction transistor includes a base, a collector and an emitter. The output switch selectively activates an output signal of the zero crossing detecting circuit according to an activation voltage level applied between the base and the emitter. The emitter is biased at a second DC voltage level that is different from the first DC voltage level. A voltage difference between the second DC voltage level and the first DC voltage level is substantially equal to the activation voltage level. The base receives a signal from the second terminal. The control system includes a switching device and a controller including a microprocessor. The microprocessor monitors the output signal of the zero crossing detecting circuit and controls an operation of the switching device based on the output signal of the zero crossing detecting circuit.

In accordance with another aspect of the present invention, provided is a control system for a domestic appliance. The control system includes a zero crossing detecting circuit for detecting a zero crossing of an AC signal. The zero crossing detecting circuit includes a transformer having a primary portion and a secondary portion. The primary portion receives the AC signal. The secondary portion comprises a first terminal and a second terminal. The zero crossing detecting circuit includes a first NPN transistor comprising a first base, a first collector, and a first emitter. The first base is connected to said first terminal. The first terminal is biased above circuit ground by the first NPN transistor at substantially the base-emitter voltage VBE of the first NPN transistor. The zero crossing detecting circuit includes a second NPN transistor comprising a second base, a second collector and a second emitter. The second emitter is biased at a lower voltage than the first terminal, and a voltage difference between the first terminal and the second emitter is substantially equal to the base-emitter voltage VBE of the first NPN transistor. The second base receives a signal from the second terminal. The second NPN transistor selectively activates an output signal of the zero crossing detecting circuit based on the zero crossing of the AC signal. The control system includes a relay and a controller that monitors the output signal of the zero crossing detecting circuit and controls an operation of the relay based on the output signal of the zero crossing detecting circuit.

DETAILED DESCRIPTION OF THE INVENTION

Figure 1:
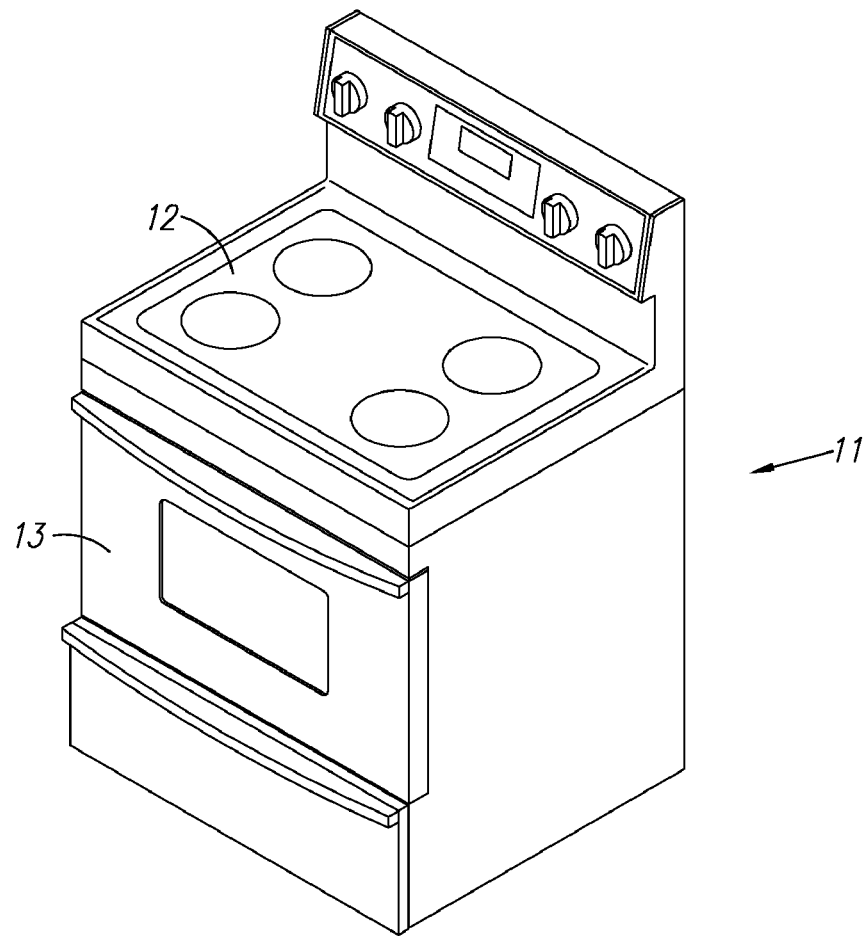
FIG. 1 is a perspective view of a domestic appliance.

The present invention relates to appliance control systems, and particularly to appliance control systems having a circuit for detecting a zero crossing of an AC signal. The present invention will now be described with reference to the drawings, wherein like reference numerals are used to refer to like elements throughout. In the following description, for purposes of explanation, numerous specific details are set forth in order to provide a thorough understanding of the present invention. It may be evident, however, that the present invention can be practiced without these specific details. Additionally, other embodiments of the invention are possible and the invention is capable of being practiced and carried out in ways other than as described. The terminology and phraseology used in describing the invention is employed for the purpose of promoting an understanding of the invention and should not be taken as limiting.

As used herein, the terms "connected" and "connected to" refer a physical and/or electrical joining or linking of one thing to another, and includes direct and indirect connections. For example, the emitter of an NPN transistor can be connected to a circuit ground by a direct electrical connection between the emitter and circuit ground, such as via a copper trace on a circuit board. Alternatively, the emitter can be connected to circuit ground via an indirect electrical connection, such as through an interposing resistor. In the former case, the emitter is directly connected to circuit ground. In the latter case, the emitter is indirectly connected to circuit ground. However, in both cases, the emitter is connected to circuit ground.

It can be useful to determine the zero crossing point of a periodic signal, such as a power supply waveform of an AC power source. Zero crossing detection allows the operation of switching devices, such as relays and the like, to be timed to the zero crossing of the AC power source. By timing the operation of a relay to the zero crossing of the AC power source, arcing across the contacts of the relay can be minimized and the life of the relay prolonged. Zero crossing detection can also be used in the synchronization of devices, such as clocks, for example.

The zero crossing detecting circuits that are discussed below employ a biasing arrangement with respect to the secondary side of an isolation transformer and an output switch having an activation voltage level (e.g., a voltage level required by the switch to trigger its switching operation). The voltage difference between the bias voltage of the switch and the bias voltage of the isolation transformer secondary substantially equals the activation voltage level of the switch. An AC waveform is applied to the primary side of the isolation transformer. Substantially at a zero crossing of the AC waveform, the output switch turns on or turns off, due to the biasing arrangement and the zero crossing sensed by the output switch through the isolation transformer. The biasing arrangement places the voltage difference between the bias voltage of the switch and the bias voltage of the isolation transformer secondary at substantially the activation voltage level of the switch and, therefore, the positive/negative voltage change of the zero crossing triggers a switching operation of the output switch. The output switch does not delay its switching until the output of the isolation transformer rises to or drops below the activation voltage level, but essentially switches as soon as there is a zero crossing of the AC waveform, such as within a fractional degree, or within 1 degree, or within 2 degrees of a zero crossing, for example.

Among other applications, the zero crossing detecting circuits that are discussed below can be applied in devices in which a controller controls the operation of a switching device to control the supply of electrical energy to another device (e.g., a fan or a heating element) through the switching device. Example switching devices include electromechanical and solid state relays, transistors, silicon-controlled rectifiers (SCRs), triacs, and the like. The zero crossing detecting circuits can further be applied in devices in which synchronization based on the zero crossing of a periodic signal is desired.

FIG. 1 shows a domestic appliance 11 that can include a controller and a zero crossing detecting circuit. The appliance in FIG. 1 is a cooking appliance, such as an electric or gas range having a cooktop 12 and/or an oven cavity 13. It is to be appreciated that zero crossing detecting circuit can be used in domestic appliances other than cooking appliances, such as refrigerators, freezers, dishwashers, washing machines, dryers, and the like. The zero crossing detecting circuit can also be used in devices such as heating, ventilating and air-conditioning (HVAC) equipment (e.g., a furnace), home automation equipment, garage door openers and pump controllers, for example.

Figure 2:
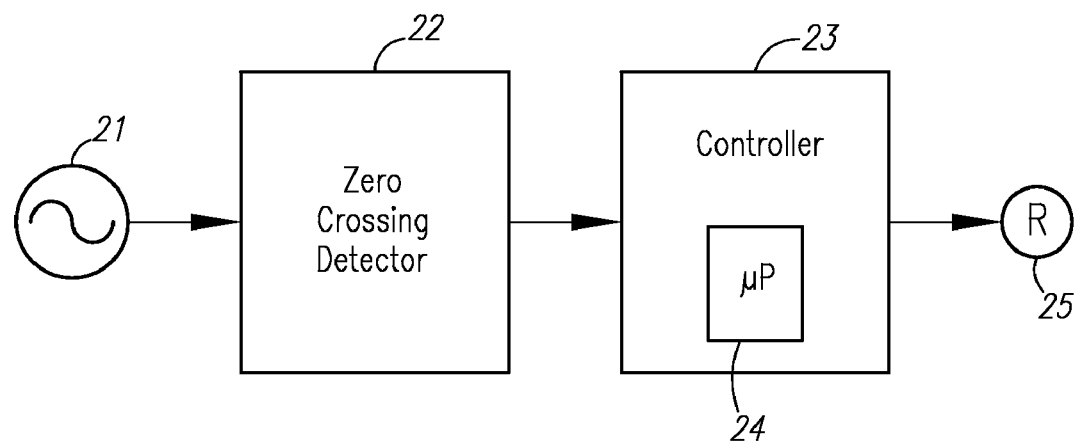
FIG. 2 is a top-level schematic diagram of a control system for the appliance of FIG. 1.

FIG. 2 is a top-level schematic diagram of a control system for the appliance 11 of FIG. 1. An AC signal 21, such as a 50 or 60 Hz power supply waveform for the appliance, is monitored by a zero crossing detecting circuit 22. The zero crossing detecting circuit 22 provides an output signal to a controller 23 for the appliance. The output signal indicates the occurrence of a zero crossing of the AC signal. The output signal can be an analog signal or a digital signal. The controller 23 monitors the output signal of the zero crossing detecting circuit and controls an operation of a switching device, such as a relay 25, based on the output signal of the zero crossing detecting circuit. The output signal can be transmitted to the controller in a hardwired or wireless manner. The controller 23 can include a microprocessor or microcontroller 24 for executing a control program.

Figure 3:
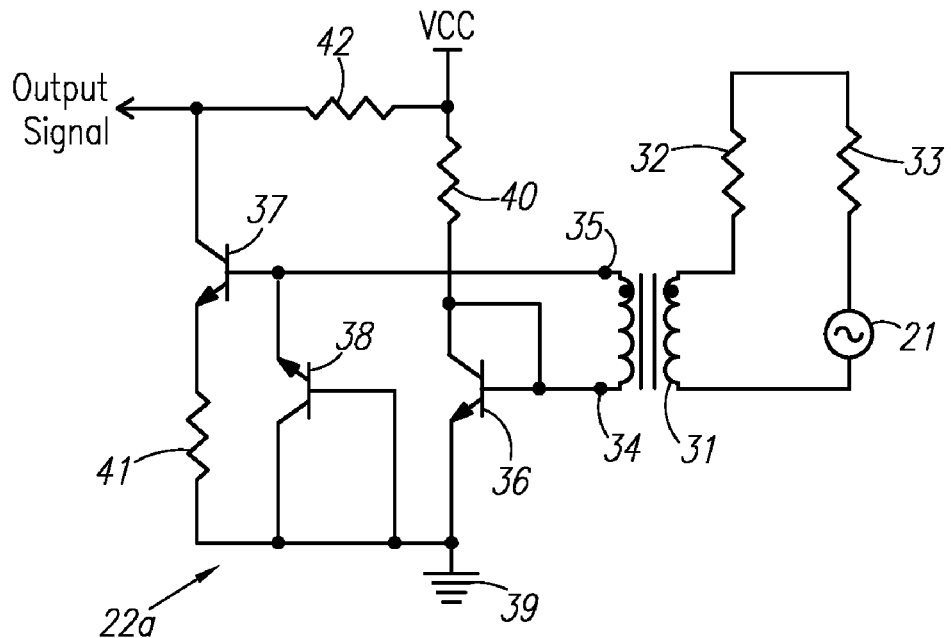
FIG. 3 is a schematic diagram of a first example zero crossing detecting circuit.

FIG. 3 is a schematic diagram of a first example zero crossing detecting circuit 22a. The AC power supply 21 is provided to the primary portion of an isolation transformer 31. The transformer 31 can be a common mode choke that is configured as a current transformer. An example common mode choke is a 1 mH to 100 µH common mode choke. Resistors 32, 33 limit the level of current flow through the primary of the transformer 31. An example value for the resistors 32, 33 is 62 kω. The secondary portion of the transformer 31 includes a first terminal 34 and a second terminal 35.

The zero crossing detecting circuit 22a includes first, second and third transistors 36, 37, 38. The transistors 36, 37, 38 can be bipolar junction transistors, such as NPN transistors (as shown) or PNP transistors.

The base and collector of the first transistor 36 are directly connected together and to the first terminal 34 of the transformer secondary. The emitter of the first transistor is directly connected to a circuit ground 39. With the emitter of the first transistor 36 connected to circuit ground 39, the first terminal 34 of the transformer secondary is positively biased at the base-emitter voltage $V_{BE}$ of the first transistor. The base-emitter voltage $V_{BE}$ is the voltage level required to forward bias the base-emitter junction when the transistor operates in its saturation region, which is typically about 700 mV DC. It is to be appreciated that the DC bias voltage level at the first terminal 34 is equal to the DC voltage level at the base and collector of the first transistor 36. The first transistor 36 is itself biased by a voltage source VCC (e.g., 5 VDC, 3.3 VDC, etc.) through a resistor 40. An example value for the resistor 40 is 2.2 kω.

Because the base and collector of the first transistor 36 are connected together, the first transistor is configured as a diode. In an embodiment, the first transistor 36 is excluded and a diode is used in its place.

The second transistor 37 is an output switch of the zero crossing detecting circuit 22a that selectively activates an output signal, for example, generates a square wave, based on the zero crossing of the AC power supply 21.

Figure 4:
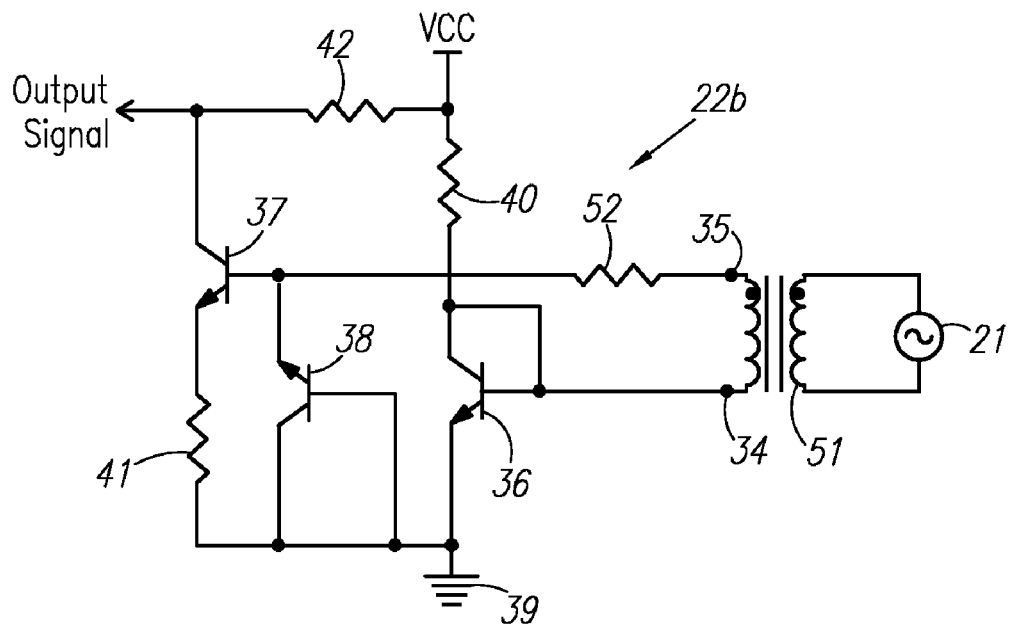
FIG. 4 is a schematic diagram of a second example zero crossing detecting circuit; and circuit.

The base of the second transistor 37 is connected to the second terminal 35 of the transformer 31. The base of the second transistor 37 can be directly connected to the second terminal 35 of the transformer 31, or indirectly connected through a resistor (as shown in FIG. 4). The base of the second transistor 37 receives a signal from the second terminal 35. The emitter of the second transistor 37 is connected to circuit ground 39. The emitter of the second transistor 37 can be indirectly connected to circuit ground through a resistor 41, or directly connected to circuit ground (in which case the resistor 41 is eliminated from the circuit 22a). However, the resistor 41 can help to ensure that the second transistor 37 is sufficiently off to cause the output signal to assume a high logic level when the AC power supply 21 is at 0 VAC.

The output signal is provided at the collector of the second transistor 37. A resistor 42 is located between the collector of the second transistor 37 and the voltage source VCC. An example value for the resistor 42 is 4.7 kω.

Via its connection to circuit ground 39, the emitter of the second transistor 37 is biased at a different DC voltage than the first terminal 34. In this case, the second transistor 37 is biased at circuit ground or 0 VDC.

An activation voltage level of the second transistor 37 is the base-emitter voltage $V_{BE}$ required to place the second transistor 37 in its saturation region and cause the transistor to turn on (e.g., 700 mV). When the second transistor 37 senses the activation voltage level between its base and emitter, the second transistor turns on and the output signal becomes a low logic level.

The first terminal 34 of the transformer 31 secondary is positively biased at the base-emitter voltage $V_{BE}$ of the first transistor 36. When the second transistor 37 is off, the voltage difference between the first terminal 34 and the emitter of the second transistor 37 is, ideally, equal to the voltage difference between the base and emitter of the first transistor 36. The voltage difference between the first terminal 34 and the emitter of the second transistor 37 may be substantially equal to the voltage difference between the base and emitter of the first transistor 36, given local temperature differences between components, component manufacturing tolerances, circuit voltage drops, and the like. If the first and second transistors 36, 37 are identical transistors, then the voltage difference between the first 34 terminal and the emitter of the second transistor 37 is substantially equal to the activation voltage of the second transistor 37. In this case, the second transistor 37 is ready to turn on immediately after the AC power supply 21 has a negative-to-positive zero crossing. For example, the second transistor can turn on within 2 degrees, or within 1 degree, or within ½ of a degree of a negative-to-positive zero crossing.

It is to be appreciated that if the first terminal 34 of the transformer 31 and the emitter of the second transistor 37 were to be biased at the same voltage level, such as circuit ground for example, then the second transistor would not be ready to turn on as soon as the AC power supply 21 has a negative-to-positive zero crossing. In this case, the second transistor 37 would not turn on until the AC power supply 21 voltage rises to a point at which the base of the second transistor 37 senses the activation voltage $V_{BE}$, which can occur about 3 or 4 degrees after the actual negative-to-positive zero crossing.

The third transistor 38 in circuit 22a is configured as a diode. The collector and base of the third transistor 38 are directly connected to circuit ground 39. The emitter of the third transistor 38 is directly connected to the base of the second transistor 37. The third transistor can help to protect the base-emitter junction of the second transistor 37 from damage that may be caused by a negative voltage applied to the second transistor when the AC power supply 21 has a positive-to-negative zero crossing. In an embodiment, the third transistor 38 is excluded and a diode is used in its place.

Example commercially available transistors that can be used for the first and second transistors 36, 37 include MMBT5508 and MMBT4401. An example commercially available transistor that can be used for the third transistor 38 is MMBT3904.

In an embodiment, the first and second transistors 36, 37 have matching thermal characteristics. Matching thermal characteristics can be obtained by selecting identical types of transistors for the first and second transistors 36, 37. For example, if both the first and second transistors 36, 37 are MMBT4401 type, they will have matching thermal characteristics. Temperature drift of the base-emitter voltages $V_{BE}$ of the first and second transistors 36, 37 can be compensated for by selecting transistors having matching thermal characteristics. An example temperature drift is 2.2 mV/° C. In a cooking appliance, the ambient temperature of the first and second transistors can change significantly, such as by 100° C., for example. Such a temperature change could lead to errors in determining a zero crossing if the first and second transistors are not thermally matched. In addition to having matching thermal characteristics, the first and second transistors 36, 37 can be located near each other, such as on a common circuit board, so that they operate under the same ambient conditions.

FIG. 4 is a schematic diagram of a second example zero crossing detecting circuit 22b. A voltage transformer 51 is used in the circuit 22b, rather than a common mode choke that is configured as a current transformer, and the resistors 32 and 33 have been removed. An example voltage transformer 51 is a 120 or 240 VAC to 12 VAC transformer. A resistor 52 is connected between the second terminal 35 of the transformer 51 and the base of the second transistor 37. An example value for the resistor 52 is 15 kω. The remaining portions of circuit 22b operate as discussed above with respect to circuit 22a.

Figure 5:
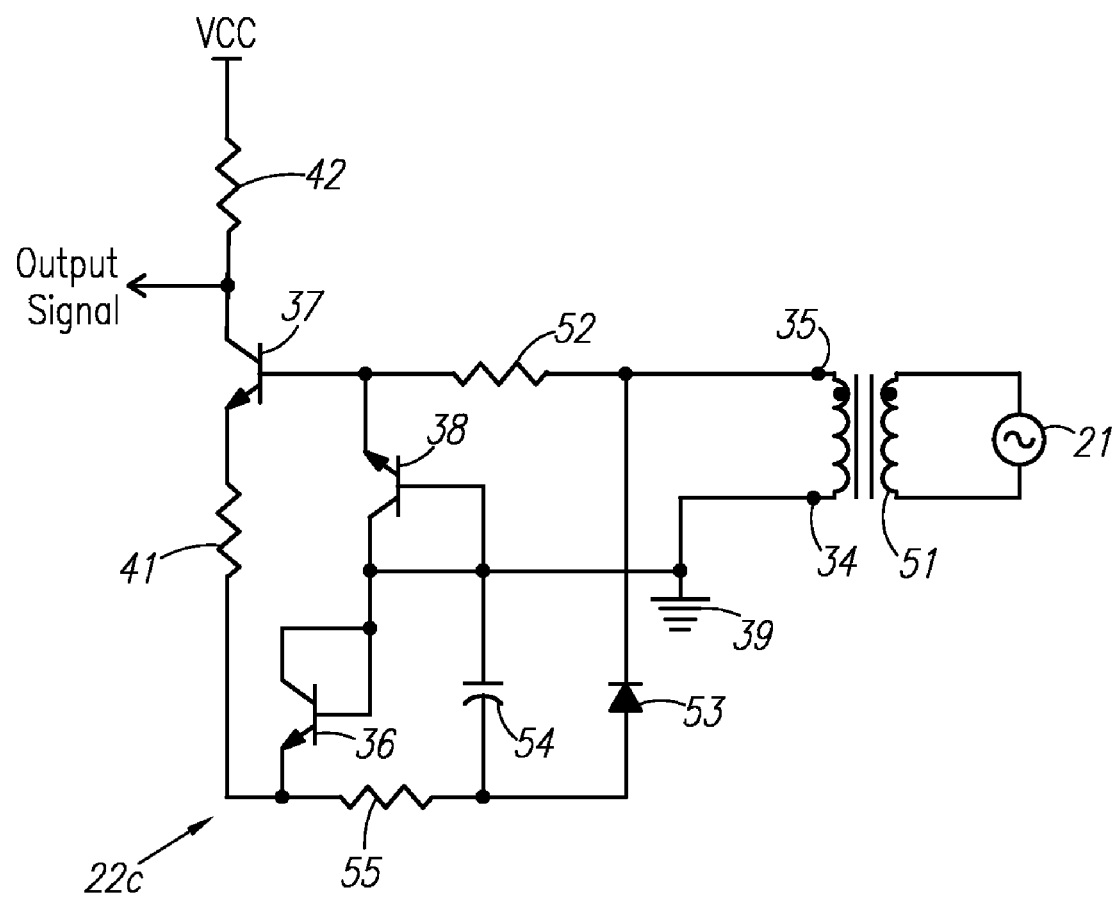
FIG. 5 is a schematic diagram of a third example zero crossing detecting circuit.

FIG. 5 is a schematic diagram of a third example zero crossing detecting circuit 22c. A difference between circuit 22c and circuits 22a and 22b is that, in circuit 22c, the first terminal 34 of the transformer 51 is biased at circuit ground 39 (e.g., 0 VDC) and the emitter of the second transistor 37 is biased at $-V_{BE}$ (e.g., −700 mV DC) by the first transistor 36. In circuit 22c, the first terminal 34 and the base and collector of the first transistor 36 are directly connected to circuit ground 39. The emitter of the first transistor 36 is connected to the emitter of the second transistor 37 through the resistor 41. As in circuits 22a and 22b, the second transistor 37 in circuit 22c is ready to turn on immediately after the AC power supply 21 has a negative-to-positive zero crossing.

Circuit 22c includes a diode 53 that charges a capacitor 54 to a negative voltage level each time the AC power supply 21 becomes negative. The negative voltage level, for example—16 volts, provides bias current through a resistor 55 and the first transistor 36. An example commercially available diode 53 is MMBD4148. An example value for the capacitor 54 is 22 μF, 25 V. An example value for the resistor 55 is 2.2 kω

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A control system, comprising:
   a zero crossing detecting circuit for detecting a zero crossing of an AC signal, wherein the zero crossing detecting circuit includes:
   a transformer having a primary portion and a secondary portion,
   wherein the primary portion receives the AC signal,
   wherein the secondary portion comprises a first terminal and a second terminal, and
   wherein the first terminal is biased at a first DC voltage level;
   an output switch operatively connected to the second terminal and having an on state and an off state, wherein the output switch selectively activates an output signal of the zero crossing detecting circuit according to an activation voltage level sensed by the output switch and corresponding to the zero crossing of the AC signal,
   wherein, while in the off state, the output switch is biased at a second DC voltage level, and a voltage difference between the first and second DC voltage levels substantially equals the activation voltage level; and
   a controller that monitors the output signal of the zero crossing detecting circuit and controls an operation based on the output signal of the zero crossing detecting circuit.

2. The control system of claim 1, further comprising a relay, wherein the operation is a relay operation.

3. The control system of claim 1, further comprising:
   a first bipolar junction transistor that biases one of the first terminal at the first DC voltage level and the output switch at the second DC voltage level; and
   a second bipolar junction transistor, wherein the output switch includes the second bipolar junction transistor.

4. The control system of claim 1, further comprising:
   a first NPN transistor comprising a first base, a first collector and a first emitter, wherein the first base, the first collector and the first terminal are directly connected to circuit ground, and
   wherein the output switch includes a second NPN transistor comprising a second base, a second collector and a second emitter, wherein the second base receives a signal from the second terminal.

5. The control system of claim 1, further comprising:
   a first NPN transistor comprising a first base, a first collector and a first emitter, wherein the first base is directly connected to the first terminal, and further wherein the first terminal is positively biased above circuit ground by the first NPN transistor at substantially the base-emitter voltage $V_{BE}$ of the first NPN transistor, and
   wherein the output switch includes a second NPN transistor comprising a second base, a second collector and a second emitter, wherein the second base receives a signal from the second terminal.

6. The control system of claim 5, wherein the first and second NPN transistors have matching thermal characteristics.

7. The control system of claim 5, wherein the transformer is a common mode choke configured as a current transformer.

8. The control system of claim 7, further comprising a third NPN transistor comprising a third base, a third collector and a third emitter,
   wherein the third base and the third collector are directly connected to circuit ground, and
   wherein the third emitter is directly connected to the second base.

9. A control system for a domestic appliance, comprising:
   a zero crossing detecting circuit for detecting a zero crossing of an AC signal, wherein the zero crossing detecting circuit includes:
   a transformer having a primary portion and a secondary portion,
   wherein the primary portion receives the AC signal, and
   wherein the secondary portion comprises a first terminal and a second terminal;
   a first bipolar junction transistor comprising a first base, a first collector, and a first emitter, wherein a DC bias voltage level at the first terminal substantially equals a DC voltage level at the first base and the first collector; and
   a second bipolar junction transistor comprising a second base, a second collector and a second emitter,
   wherein the second bipolar junction transistor is biased at another DC voltage level that is different from the DC bias voltage level at the first terminal, and wherein a voltage difference between the another DC voltage level and the DC bias voltage level at the first terminal substantially equals a voltage difference between the first base and the first emitter,
   wherein the second base receives a signal from the second terminal and,
   wherein the second bipolar junction transistor selectively activates an output signal of the zero crossing detecting circuit based on the zero crossing of the AC signal;
   a switching device; and
   a controller including a microprocessor, wherein the microprocessor monitors the output signal of the zero crossing detecting circuit and controls an operation of the switching device based on the output signal of the zero crossing detecting circuit.

10. The control system of claim 9, wherein a voltage level at the first and second emitters substantially equals a circuit ground voltage level.

11. The control system of claim 9, wherein the DC bias voltage level at the first terminal substantially equals a circuit ground voltage level.

12. The control system of claim 11, wherein the first and second bipolar junction transistors are NPN transistors having matching thermal characteristics.

13. The control system of claim 12, wherein the domestic appliance is a cooking appliance that includes a cooktop and an oven cavity.

14. A control system for a domestic appliance, comprising:
   a zero crossing detecting circuit for detecting a zero crossing of an AC signal, wherein the zero crossing detecting circuit includes:
   a circuit ground having a circuit ground voltage level;
   a transformer having a primary portion and a secondary portion,
   wherein the primary portion receives the AC signal, wherein the secondary portion comprises a first terminal and a second terminal, and
wherein the first terminal is biased at a first DC voltage level that is not equal to the circuit ground voltage level;
an output switch comprising a bipolar junction transistor, the bipolar junction transistor including a base, a collector and an emitter,
wherein the output switch selectively activates an output signal of the zero crossing detecting circuit according to an activation voltage level applied between the base and the emitter,
wherein the emitter is biased at a second DC voltage level that is different from the first DC voltage level, and wherein a voltage difference between the second DC voltage level and the first DC voltage level is substantially equal to the activation voltage level, and
wherein the base receives a signal from the second terminal;
a switching device; and
a controller including a microprocessor, wherein the microprocessor monitors the output signal of the zero crossing detecting circuit and controls an operation of the switching device based on the output signal of the zero crossing detecting circuit.

15. The control system of claim 14, further comprising another bipolar junction transistor including another base, another collector and another emitter,
wherein the bipolar junction transistors are NPN transistors,
wherein a voltage level at the another base substantially equals a voltage level at the another collector and at the first terminal,
wherein the first terminal is positively biased above circuit ground by the another bipolar junction transistor at substantially the base-emitter voltage $V_{BE}$ of the another transistor, and
wherein the voltage difference between the second DC voltage level and the first DC voltage level is substantially equal to a voltage difference between the another base and the another emitter.

16. The control system of claim 15, wherein the bipolar junction transistors have matching thermal characteristics, and further wherein the transformer is a common mode choke configured as a current transformer.

17. The control system of claim 16, wherein the another base and the another collector are directly connected to the first terminal,
wherein the another emitter is directly connected to circuit ground,
wherein the base of the output switch is connected to the second terminal, and
wherein the emitter of the output switch is connected to circuit ground either directly or through a resistor.

18. The control system of claim 17, further comprising a third bipolar junction transistor that is an NPN transistor having a third base, a third collector, and a third emitter,
wherein the third base and the third collector are directly connected to circuit ground, and
wherein the third emitter is directly connected to the base of the output switch.

19. The control system of claim 18, wherein the domestic appliance is a cooking appliance that includes a cooktop and an oven cavity.

20. A control system for a domestic appliance, comprising:
a zero crossing detecting circuit for detecting a zero crossing of an AC signal, wherein the zero crossing detecting circuit includes:
a transformer having a primary portion and a secondary portion,
wherein the primary portion receives the AC signal, and
wherein the secondary portion comprises a first terminal and a second terminal;
a first NPN transistor comprising a first base, a first collector, and a first emitter,
wherein the first base is connected to said first terminal, and
wherein the first terminal is biased above circuit ground by the first NPN transistor at substantially the base-emitter voltage $V_{BE}$ of the first NPN transistor; and
a second NPN transistor comprising a second base, a second collector and a second emitter,
wherein the second emitter is biased at a lower voltage than the first terminal, and a voltage difference between the first terminal and the second emitter is substantially equal to the base-emitter voltage $V_{BE}$ of the first NPN transistor,
wherein the second base receives a signal from the second terminal and,
wherein the second NPN transistor selectively activates an output signal of the zero crossing detecting circuit based on the zero crossing of the AC signal;
a relay; and
a controller that monitors the output signal of the zero crossing detecting circuit and controls an operation of the relay based on the output signal of the zero crossing detecting circuit.

21. The control system of claim 20, wherein the first and second NPN transistors have matching thermal characteristics, and further wherein the transformer is a common mode choke configured as a current transformer.

22. The control system of claim 21, wherein the first base and the first collector are directly connected to the first terminal,
wherein the first emitter is directly connected to circuit ground,
wherein the second base is directly connected to the second terminal, and
wherein the second emitter is connected to circuit ground either directly or through a resistor.

23. The control system of claim 22, further comprising a third NPN transistor having a third base, a third collector, and a third emitter,
wherein the third base and the third collector are directly connected to circuit ground, and
wherein the third emitter is directly connected to the second base.

24. The control system of claim 23, wherein the domestic appliance is a cooking appliance that includes a cooktop and an oven cavity.

* * * * *